US006217658B1

(12) United States Patent
Orczyk et al.

(10) Patent No.: US 6,217,658 B1
(45) Date of Patent: Apr. 17, 2001

(54) SEQUENCING OF THE RECIPE STEPS FOR THE OPTIMAL LOW-DIELECTRIC CONSTANT HDP-CVD PROCESSING

(75) Inventors: Maciek Orczyk, Cupertino; Laxman Murugesh, Fremont; Pravin Narwankar, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/328,709

(22) Filed: Jun. 9, 1999

Related U.S. Application Data

(62) Division of application No. 08/868,286, filed on Jun. 3, 1997.

(51) Int. Cl.[7] ................................................... C23C 16/00
(52) U.S. Cl. ......................... 118/697; 118/723 I; 118/715
(58) Field of Search .................................. 118/715, 719, 118/695, 696, 697, 698, 710, 723 I; 156/345

(56) References Cited

U.S. PATENT DOCUMENTS

| 4,851,370 | 7/1989 | Doklan et al. ........................ 437/225 |
| 4,872,947 | 10/1989 | Wang et al. ........................... 156/643 |
| 4,894,352 | 1/1990 | Lane et al. ............................. 437/238 |
| 5,000,113 | 3/1991 | Wang et al. ........................... 118/723 |
| 5,013,691 | 5/1991 | Lory et al. ............................ 437/238 |

(List continued on next page.)

FOREIGN PATENT DOCUMENTS

| 0198361A2 | 10/1986 | (EP) .............................. C23C/16/48 |
| 0299249A1 | 1/1989 | (EP) .............................. C23C/16/40 |
| 0599730A2 | 6/1994 | (EP) . |
| 2173822A | 10/1986 | (GB) ............................. C23C/16/52 |
| 2313954A | 12/1997 | (GB) ........................... H01L/21/316 |
| 61-276977 | 12/1986 | (JP) ............................... C23C/16/50 |
| 4-239750 | 8/1992 | (JP) ............................... H01L/21/90 |
| 4-341568 | 11/1992 | (JP) ............................... C23C/16/40 |
| WO 92/20833 | 11/1992 | (WO) ........................... C23C/16/00 |

OTHER PUBLICATIONS

Carl et al., "The Effect of $O_2$:$C_2F_6$ Ratios and Low Frequency Power on the Gap Fill Properties and Stability of F–TEOS Films", DUMIC Conference, Feb. 1995, pp. 234–249.

Chang et al., "Frequency Effects and Properties of Plasma Deopsited Flourinated Silicon Nitride", J. Vac. Sci. Technol. B6 (2) 1988, pp. 524–532.

Chang et al., "Influences of Depostion Temperature on Thermal Stability and Moisture Resistance of Chemical Vapor Deposited FLourinated Siliconoxide by Using Indirect Fluorinating Precursor", Applied Physics Letters, Aug. 26, 1996, vol. 69, No. 9, pp. 1238–1240.

Fukada et al., "Preparation of SiOF Films with Low Dielectric Constant by ECR Plasma CVD", DUMIC Conference, Feb. 1995, pp. 43–49.

Galiano et al., "Stress–Temperature Behavior of Oxide Films used for Intermetal Dielectric Applications", VMIC Conference, Jun. 1992, pp. 100–106.

(List continued on next page.)

Primary Examiner—Gergory Mills
Assistant Examiner—P. Hassanzadel
(74) Attorney, Agent, or Firm—Townsend, Townsend & Crew

(57) ABSTRACT

A sequence of process steps forms a fluorinated silicon glass (FSG) layer on a substrate. This layer is much less likely to form a haze or bubbles in the layer, and is less likely to desorb water vapor during subsequent processing steps than other FSG layers. An undoped silicon glass (USG) liner protects the substrate from corrosive attack. The USG liner and FSG layers are deposited on a relatively hot wafer surface and can fill trenches on the substrate as narrow as 0.8 $\mu$m with an aspect ratio of up to 4.5:1.

12 Claims, 8 Drawing Sheets

U.S. PATENT DOCUMENTS

| | | | |
|---|---|---|---|
| 5,156,881 | 10/1992 | Okano et al. | 427/572 |
| 5,215,787 | 6/1993 | Homma | 427/248.1 |
| 5,275,977 | 1/1994 | Otsubo et al. | 437/235 |
| 5,288,518 | 2/1994 | Homma | 427/255 |
| 5,314,724 | 5/1994 | Tsukune et al. | 427/489 |
| 5,319,247 | 6/1994 | Matsuura | 257/760 |
| 5,334,552 | 8/1994 | Homma | 437/195 |
| 5,385,763 | 1/1995 | Okano et al. | 427/572 |
| 5,399,529 | 3/1995 | Homma | 437/195 |
| 5,413,967 | 5/1995 | Matsuda et al. | 437/235 |
| 5,420,075 | 5/1995 | Homma et al. | 437/195 |
| 5,429,995 | 7/1995 | Nishiyama et al. | 437/238 |
| 6,019,848 * | 2/2000 | Frankel et al. | 118/715 |
| 6,063,198 * | 5/2000 | Bang et al. | 118/715 |

OTHER PUBLICATIONS

Hayasaka et al., "High–Quality and Low Dielectric Constant $SiO_2$ CVD Using High Density Plasma", Dry Process Symposium, Nov. 1994, pp. 163–168.

Lucovsky et al., "Deposition of Silicon Dioxide and Silicon Nitride by Remote Plasma Enhanced Chemical Vapor Deposition", J. Vac. Sci. Technol., vol. 4, No. 3, May/Jun. 1986, pp. 681–688.

Matsuda et al., "Dual Frequency Plasma CVD Fluorosilicate Glass Deposition for 0.25 $\mu$m Interlevel Dielectrics", DUMIC Conference, Feb. 1995, pp. 22–28.

Musaka et al., "Single Step Gap Filling Technology for Subhalf Micron Metal Spacings on Plasma Enhanced TEOS/$O_2$ Chemical Vapor Deposition System", Extended Abstracts of the 1993 International Conference on Solid State Devices and Materials, Makuhari, 1993, pp. 510–512.

Qian et al., "High Density Plasma Deposition and Deep Submicron Gap Fill with Low Dielectric Constant SIOF Films", DUMIC Conference, Feb, 1995, pp. 50–56.

Ravi K. Laxman, "Low $\in$ Dielectrics: CVD Fluorinated Silicon Dioxides", Semiconductor International, May 1995, pp. 71–74.

Robles et al., "Effects of RF Frequency and Deposition Rates on the Moisture Resistance of PECVD TEOS–Based Oxide Films", vol. 92–1, ECS Extended Abstracts, p. 215, Abstract 129, May 1992.

Secrist et al., "Deposition of Silica Films by the Glow Discharge Technique", J. Electrochem. Soc., vol. 113, No. 9, Sep. 1966, pp. 914–920.

Shapiro et al., "Dual Frequency Plasma CVD Fluorosilicate Glass Water Absorption and Stability", DUMIC Conference, Feb. 1995, pp. 118–123.

Shapiro et al., "CVD of Fluorisilicate Glass for ULSI Applications" Thin Solid Films, vol. 270, No. 1/2, Dec. 1, 1995, pp. 503–507.

Takeishi et al., "Stabilizing Dielectric Constants of Fluorine–Doped–SiO2 Films by N2O–Plasma Annealing", DUMIC Conference, Feb. 1995, pp. 234–240.

Yu et al., "Step Coverage Study of Peteos Deposition for Intermetal Dielectric Applications", VMIC Conference, Jun. 1990, pp. 166–172.

* cited by examiner

SEQUENCING OF THE RECIPE STEPS FOR THE OPTIMAL LOW-DIELECTRIC CONSTANT HDP-CVD PROCESSING

This application is a divisional of Ser. No. 08/868,286 filed on Jun. 3, 1997.

BACKGROUND OF THE INVENTION

The present invention relates to the fabrication of integrated circuits. More particularly, the invention provides a technique, including a method and apparatus, for the deposition of a high-quality fluorine-doped insulating film having a reduced dielectric constant.

Semiconductor device geometries continue to decrease in size, providing more devices per fabricated wafer and faster devices. Currently, some devices are being fabricated with less than 0.25 $\mu$m spacing between features; in some cases there is as little as 0.18 $\mu$m spacing between device features. An example of these features are conductive lines or traces patterned on a layer of metal. A nonconductive layer of dielectric material, such as silicon dioxide, is often deposited between and over the patterned metal layer. This dielectric layer may serve several purposes, including protecting the metal layer from physical or chemical damage, insulating the metal layer from other layers, and insulating the conductive features from each other. As the spacing, or gap, between these conductive features decreases, it becomes more difficult to fill that gap with the dielectric material.

Processing wafers with aluminum traces requires keeping the temperature of the wafer below where damage may occur to the aluminum. The aluminum may be damaged by melting or by chemical attack, including the formation of aluminum compounds. Chemical vapor deposition (CVD) typically requires elevated temperatures to induce the reactions necessary to form a layer. Various methods are used to lower the deposition temperature. Some methods focus on using highly reactive deposition gases. Other methods apply electromagnetic energy to the deposition system. Applying electromagnetic energy can both lower the temperature necessary for reaction of the deposition gases and can improve the formation of a deposited layer by moving reactant species relative to the growing layer.

Many approaches to obtain lower dielectric constants and to fill gaps with dielectric material have been proposed. One of the more promising solutions is the incorporation of halogen atoms into a silicon dioxide layer. Examples of halogen incorporation in films are described in U.S. patent application Ser. No. 08/548,391, filed Oct. 25, 1995 and entitled "METHOD AND APPARATUS FOR IMPROVING FILM STABILITY OF HALOGEN-DOPED SILICON OXIDE FILMS", and Ser. No. 08/538,696, filed Oct. 2, 1995 and entitled "USE OF $SIF_4$ TO DEPOSIT F-DOPED FILMS OF GREATER STABILITY", both of which are assigned to Applied Materials, Inc.

It is believed that fluorine, the preferred halogen dopant for silicon oxide films, lowers the dielectric constant of the silicon oxide film because fluorine is an electronegative atom that decreases the polarizability of the overall SiOF network. Fluorine-doped silicon oxide films are also referred to as fluorinated silicon glass (FSG) films.

In addition to decreasing the dielectric constant, incorporating fluorine in silicon dioxide layers can also improve the gap-filling properties of the deposited films. Because fluorine is an etching species, it is believed that fluorine etches the film as it is being deposited. This simultaneous deposition/etching effect preferentially etches the corners of the gap, keeping the gap open so that it fills with void-free FSG.

Unfortunately, there are several problems associated with some FSG layers. One problem is that a poorly formed FSG layer may absorb moisture from the atmosphere, or from the reaction products associated with the deposition process. The absorption of water raises the dielectric constant of the FSG. Absorbed water may also interfere with subsequent wafer processing steps. For many applications, it is desirable that FSG layers do not desorb significant water vapor below about 450° C.

One technique that is used to reduce water absorption and desorbtion is to bake the wafer after the FSG layer has been deposited. Baking may be done in the same chamber, immediately after depositing the FSG, or it may be done afterwards in an oven. Baking may drive off some of the water in the FSG layer, but the layer may reabsorb water from the atmosphere under some circumstances. For example, water reabsorption may not be a problem if wafer processing continues fairly soon after the FSG deposition and bake. However, in some manufacturing environments, wafer processing subsequent to the FSG deposition may not occur for days or even weeks, thus potentially providing conditions for water reabsorption. Time between wafer processing steps may arise because of work-in-process queuing, distributed manufacturing (i.e., one process step is performed in one factory location, and a subsequent processing step is performed in another factory location), or delays due to equipment maintenance, etc.

Cap layers provide one method of reducing reabsorption of water into an FSG layer. The cap layer is typically undoped silicon glass (USG) layer that is deposited onto an FSG layer with or without baking the FSG layer prior to depositing the cap. The cap may be done in a separate deposition chamber or pump-down, or the process may be streamlined to follow the FSG layer deposition in the same chamber. Cap layers may provide acceptable protection from water absorption under many conditions. However, adding a cap layer adds time to the wafer fabrication process. In some instances, for example where the total layer deposition time is fairly long, the time to add a cap layer is not significant. As wafer throughput (the number of wafers processed in a deposition chamber per hour) increases, the cap layer deposition time may become a significant portion of the total deposition time. In those instances, it may be desirable to reduce the total layer deposition time by eliminating the step of depositing a cap layer.

Corrosion is another problem associated with some FSG layers. If fluorine is loosely bound into the FSG lattice, or has accumulated as free fluorine on the surface, it may combine with water to form hydrofluoric acid (HF). HF may corrode, and even destroy, other device features such as metal traces or antireflective layers.

One technique that is used to overcome the problems of corrosion is to form a liner over the wafer before depositing the FSG. The liner is typically a thin layer of USG that acts as a barrier between device features and the FSG. A thicker liner will perform this function better. Because the liner is made of USG, it has a higher dielectric constant than the FSG layer, and a thinner liner is desired to maintain a low dielectric constant for the layer between conductive traces. The best liner thickness is a compromise between corrosion protection and low dielectric constant for the layer. As with baking and cap layers, it is desirable to form any liner in as short a time as possible to reduce the process time.

A further problem with some FSG layers is that they are unstable. In other words, the layer characteristics change over time. For example, poorly formed FSG layers may form a cloudy haze, or even bubbles, within the layer when exposed to the atmosphere. A wafer exposed to relatively dry air for a short period of time may not develop any haze, whereas the same wafer exposed to wetter air for the same period, or dry air for a longer period of time, will develop haze. Modern device fabrication often uses distributed processing, where a wafer is processed at several different locations over a period of several weeks. Wafers that develop haze are typically rejected from the processing sequence, losing the value of all the materials and processing to that point of the production sequence. Under some manufacturers' specifications, it is important that such wafers do not develop haze when exposed to the atmosphere for a period of at least three weeks.

Hazing is a subtle and difficult problem. Even the bulk resistivity of the wafer may affect a wafer's propensity to form haze. Haze formation may be related to the temperature of the wafer during deposition, which may affect how water and fluorine are incorporated into the layer. Some processing chambers use an electrostatic chuck (e-chuck) to hold the wafer in place during processing. Wafer resistivity may contribute to how strongly the wafer is held, and thus how well it thermally couples to the e-chuck. Whatever the mechanism of haze formation is, wafer resistivity adds another variable into the wafer fabrication sequence that may constrain the process flow and decrease yields.

Furthermore, speaking generally, the higher the concentration of fluorine during deposition of the FSG layer, the greater the propensity to form haze. Therefore, chip manufacturers may use a relatively low concentration of fluorine just to avoid the potential haze-forming problem. If manufacturers could rely on producing a more stable FSG film, they could increase the fluorine concentration and enjoy the resultant benefit of an FSG layer with a lower dielectric constant.

From the above, it can be seen that it is desirable to produce oxide films having reduced dielectric constants and good gap-fill properties in the shortest time possible. It is also desirable to provide a method of increasing the stability of halogen-doped oxide films, thereby reducing moisture absorption and hazing in the films, regardless of wafer resistivity.

SUMMARY OF THE INVENTION

The present invention provides a process and an apparatus for producing a stable, halogen-doped silicon oxide film with a low dielectric constant and reduced sensitivity to wafer resistivity. In one embodiment, this layer is deposited in a high-density plasma chemical vapor deposition (HDP-CVD) system. The sequence of steps prior to flowing fluorine into the chamber is crucial for the formation of a stable film.

The sequence of steps includes, in one embodiment, introducing a wafer into a chamber and setting an initial chamber pressure with process gas or gases. Then, a plasma is formed, or struck, by applying radio frequency (RF) power to a plasma coupling structure. The plasma heats the wafer above 100° C. prior to deposition.

A relatively thin layer of USG is deposited onto the heated wafer before fluorine is flowed into the deposition chamber. This thin layer acts as a liner, protecting the underlying substrate without unduly increasing the interfeature capacitance. One object of the present invention is to ensure that the surface of the wafer is still reasonably hot, at least 100° C., when fluorine is first admitted into the chamber. After the fluorine flow has started, the plasma power is reduced, cooling the wafer and enhancing the net deposition rate of the layer by increasing the deposition-to-etch ratio. The concentration of fluorine in the chamber, and hence the incorporation of fluorine into the layer, may then be increased by increasing the flow of fluorine-containing gas. This sequence provides a layer with reduced free fluorine and a low dielectric constant. The reduction of free fluorine enhances layer stability, reducing haze and bubble formation subsequent to layer formation.

For a further understanding of the objects and advantages of the present invention, reference should be made to the ensuing detailed description taken in conjunction with the accompanying drawings.

DESCRIPTION OF THE PREFERRED EMBODIMENT

I. Introduction

The present invention allows deposition of an insulating layer having a low dielectric constant and good gap-fill properties. The layer may have a relative dielectric constant of less than 3.5, and fill gaps as narrow as 0.18 μm or less and 0.8 μm high or higher. The layer is stable, meaning that haze does not form and that the relative dielectric constant does not appreciably increase in the layer over a period of several days when exposed to the atmosphere. This layer stability is relatively independent from substrate bulk resistivity.

II. An Exemplary CVD System

Figure 1A:
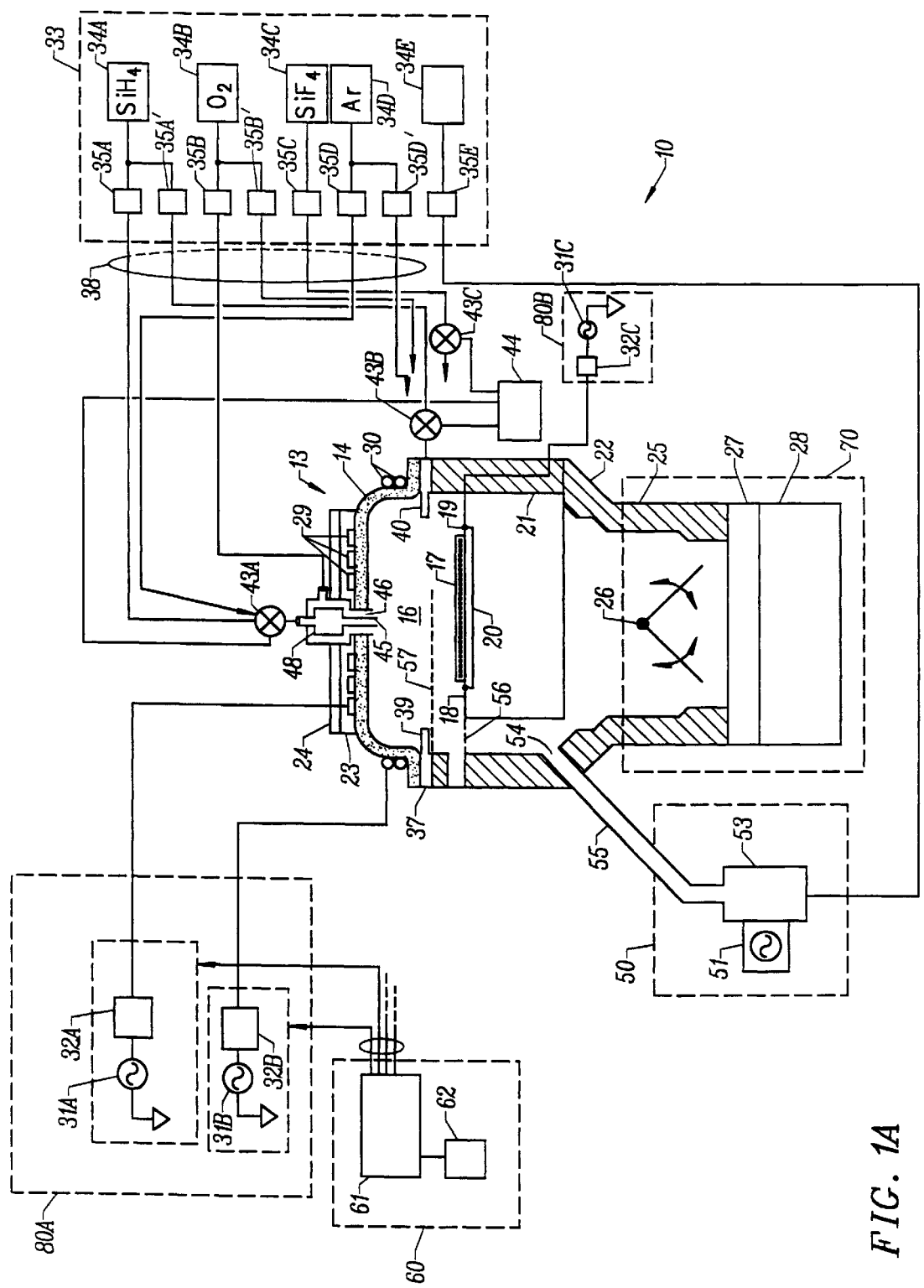
FIG. 1A is a simplified diagram of one embodiment of a high density chemical vapor deposition system according to the present invention.

FIG. 1A illustrates one embodiment of a high density plasma chemical vapor deposition (HDP-CVD) system 10, in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a dielectric material, such as alumina or aluminum nitride. Dome 14 defines an upper boundary of a plasma processing region 16. Plasma processing region 16 is bounded on the bottom by the upper surface of substrate 17 and the substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. A motor (not shown) raises and lowers a lift-pin plate (not shown) that raises and lowers lift pins (not shown) that raise and lower the wafer. Upon transfer into chamber 13, substrates are loaded onto the raised lift pins, and then lowered to a substrate receiving portion 19 of substrate support member 18. Substrate receiving portion 19 includes an electrostatic chuck 20 that secures the substrate to substrate support member 18 during substrate processing.

Vacuum system 70 includes throttle body 25, which houses twinblade throttle valve 26 and is attached to gate valve 27 and turbomolecular pump 28. It should be noted that throttle body 25 offers minimum obstruction to gas flow, and allows symmetric pumping, as described in co-pending, co-assigned U.S. patent application, originally filed on Dec. 12, 1995, and assigned Ser. No. 08/574,839, refiled on Sep. 11, 1996 and assigned Ser. No. 08/712,724 entitled "SYMMETRIC CHAMBER". Gate valve 27 can isolate pump 28 from throttle body 25, and can also control chamber pressure by restricting the exhaust flow capacity when throttle valve 26 is fully open. The arrangement of the throttle valves, gate valve, and turbomolecular pump allow accurate and stable control of chamber pressures from between about 1 to 100 millitorr.

The source plasma system 80A includes a top coil 29 and side coil 30, mounted on dome 14. A symmetrical ground shield (not shown) reduces electrical coupling between the coils. Top coil 29 is powered by top source RF generator 31A, while side coil 30 is powered by side source RF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF generator 31C and a bias matching network 32C. The bias plasma system 80B capacitively couples substrate portion 19 to body member 22, which act as complimentary electrodes. The bias plasma system 80B serves to enhance the transport of plasma species created by the source plasma system 80A to the surface of the substrate. In a specific embodiment, bias RF generator provides up to 5,000 watts of RF power at 13.56 MHz.

In addition to the RF fields that are created within process zone 16, a direct current (DC) field may be created within process zone 16. For example, providing a negative DC potential to substrate receiving portion 19 relative to body member 22 may promote the transport of positively charged ions to the surface of substrate 17.

RF generators 31A and 31B include digitally-controlled synthesizers and operate over a frequency range between about 1.7 to about 2.1 MHz. Each generator includes an RF control circuit (not shown) that measures reflected power from the chamber and coil back to the generator, and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
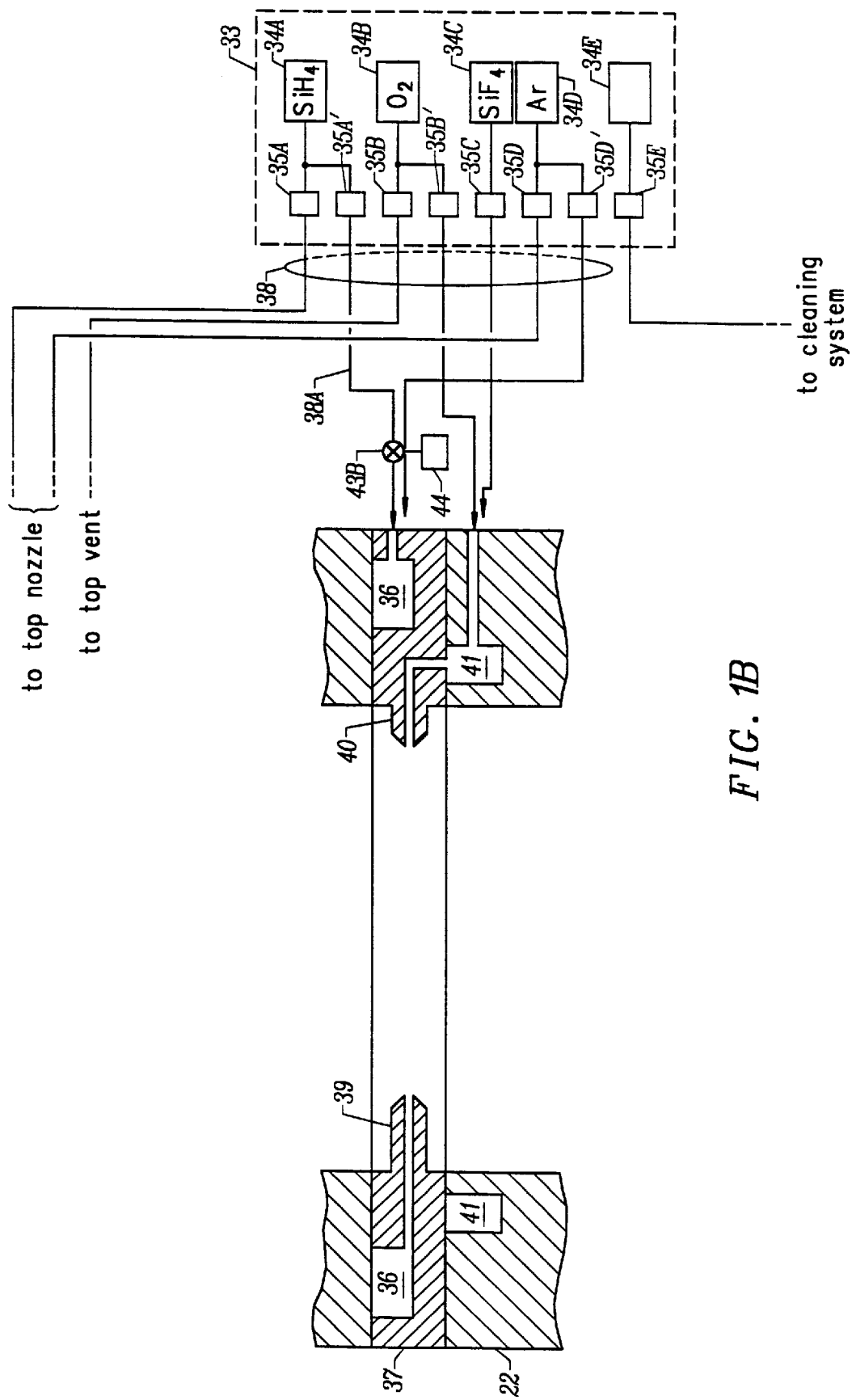
FIG. 1B is a simplified cross section of a gas ring that may be used in conjunction with the exemplary CVD processing chamber of FIG. 1A.

A gas delivery system 33 provides gases from several sources to the chamber for processing the substrate via gas delivery lines 38 (only some of which are shown). Gases are introduced into chamber 13 through a gas ring 37, a top nozzle 45, and a top vent 46. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of gas nozzles 39 and 40 (only two of which are shown) that provide a uniform flow of gas over the substrate. Nozzle length and nozzle angle may be changed by changing the gas ring 37. This allows tailoring the uniformity profile and gas utilization efficiency for a particular process within an individual chamber. In a specific embodiment, the gas ring 37 has a total of twenty-four gas nozzles, twelve first gas nozzles 40 and twelve second gas nozzles 39.

Gas ring 37 has a plurality of first gas nozzles 40 (only one of which is shown), which in a preferred embodiment are coplanar with, and shorter than, a plurality of second gas nozzles 39. In one embodiment, first gas nozzles 40 receive one or more gases from body plenum 41, and second gas nozzles 39 receive one or more gases from gas ring plenum 36. In some embodiments, it is desirable not to mix gases in the body plenum 41 and the gas ring plenum 36 before injecting the gases into the chamber 13, such as when the first gas nozzles are used to deliver oxidizer gas, such as oxygen or ozone, and the second gas nozzles are used to deliver source gas, such as silane. In other embodiments, process gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In some embodiments, flammable, toxic, or corrosive gases, such as silane or silicon tetraflouride ($SiF_4$), may be used. In these instances, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines, such as 35A and 35C. Such 3-way valves may be placed as close to chamber 13 as practical, to minimize the volume of the unvented gas delivery line (between the 3-way valve and the chamber). Additionally, two-way (on-off) valves (not shown) may be placed between an MFC and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45 through which gas may flow into the chamber from the gas delivery system. In one embodiment, first gas source 34A is a silane source that supplies source gas nozzles 39 and top nozzle 45. Source nozzle mass flow controller (MFC) 35A' controls the amount of silane delivered to second gas nozzles 39 and top nozzle MFC 35A controls the amount of silane delivered to top gas nozzle 45. Similarly, two MFCs 35B and 35B' may be used to control the flow of oxygen to both top vent 46 and first gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E, such as fluorine, silicon tetrafluoride, or equivalents, in reactor cavity 53. The reactive species resulting from this plasma are conveyed to chamber 13 through cleaning gas feed port 54 via applicator tube 55. The materials used to contain the cleaning plasma (e.g. cavity 53 and applicator tube 55) must be resistant to attack by the plasma. The distance between reactor cavity 53 and feed port 54 should be kept as short as practical, as the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in an in situ plasma. Consequently, relatively sensitive components, such as electrostatic chuck 20, do not need to be covered, with a dummy wafer or otherwise protected, as may be required with an in situ plasma cleaning process. During the cleaning process, or other processes, the gate valve 27 may be closed to isolate the turbomolecular vacuum pump 28 from the chamber. In this configuration, the foreline provides a process vacuum generated by remote vacuum pumps, which are typically mechanical vacuum pumps. Isolating the turbomolecular pump from the chamber with the gate valve protects the turbomolecular pump from corrosive compounds or other potentially harmful effects resulting from the chamber clean or other processes.

System controller 60 controls the operation of system 10. In a preferred embodiment, controller 60 includes a memory 62, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure having a 16-bit data bus and 24-bit address bus. System controller 31 operates under the control of a computer program stored on the hard disk drive or other computer programs, such as programs stored on a floppy disk. The computer program dictates, for example, the timing, mixture of gases, RF power levels and other parameters of a particular process. The interface between a user and the system controller is via a monitor, such as a cathode ray tube (CRT) 65, and a light pen 66, as depicted in FIG. 2.

Figure 2:
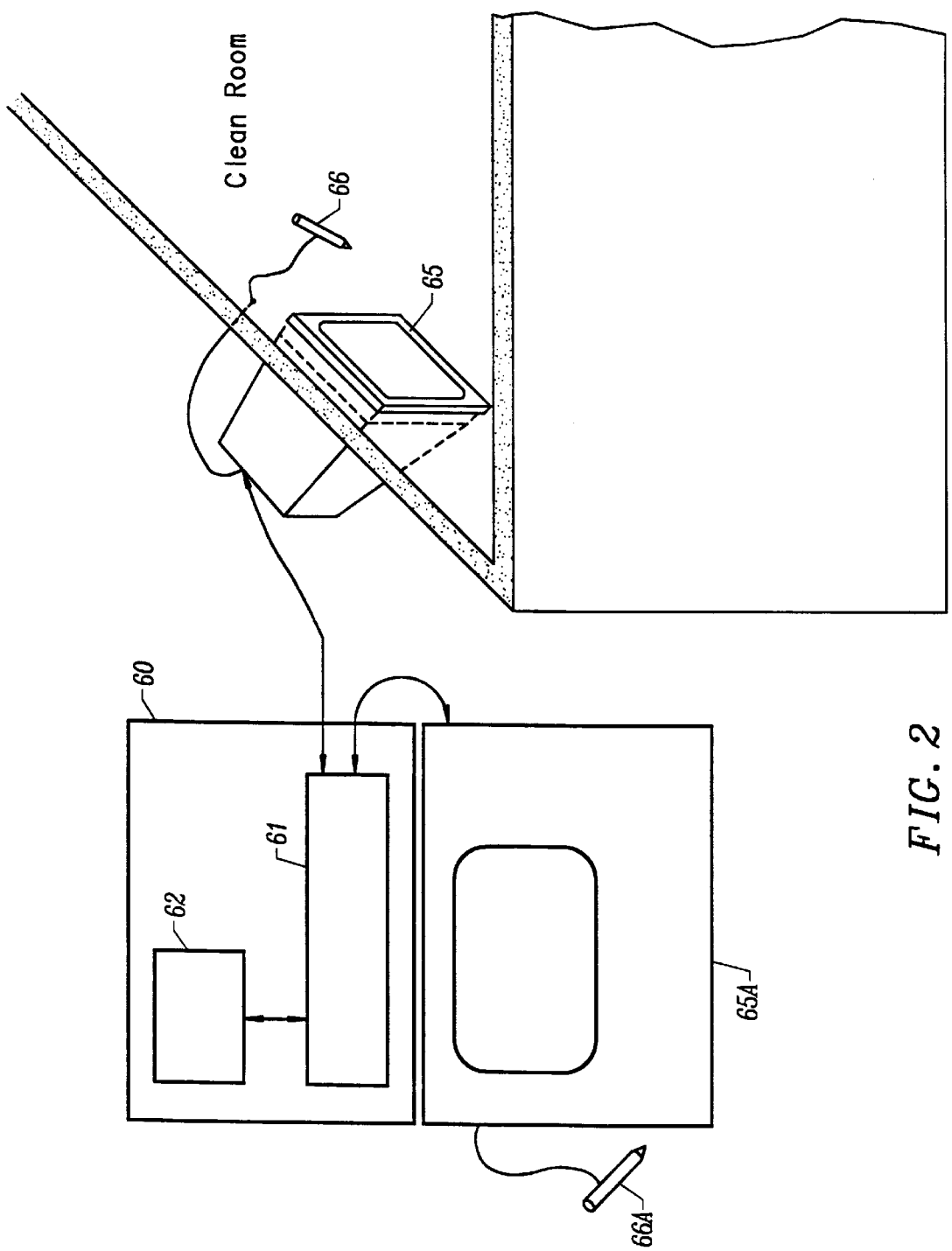
FIG. 2 is a simplified diagram of a monitor and light pen that may be used in conjunction with the exemplary CVD processing chamber of FIG. 1A.

FIG. 2 is an illustration of a portion of an exemplary system user interface used in conjunction with the exemplary CVD processing chamber of FIG. 1A. System controller 60 includes a processor 61 coupled to a memory 62. Preferably, memory 62 may be a hard disk drive, but of course memory 62 may be other kinds of memory, such as ROM, PROM, and others.

System controller 60 operates under the control of a computer program. The computer program dictates the timing, temperatures, gas flows, RF power levels and other parameters of a particular process. The interface between a user and the system controller is via a CRT monitor 65 and a light pen 66, as depicted in FIG. 2. In a preferred embodiment, two monitors, 65 and 65A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer readable programming language such as 68000 assembly language, C, C++, or Pascal. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 3:
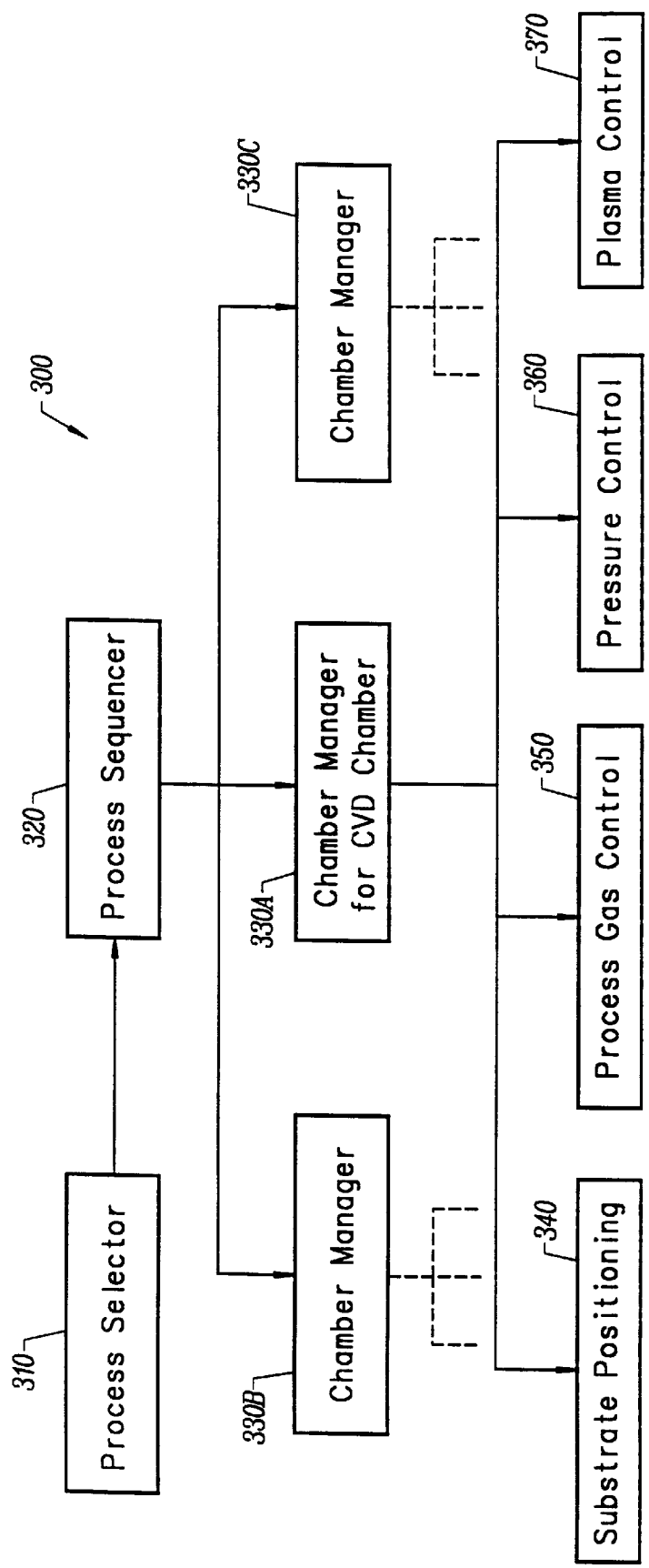
FIG. 3 is a flow chart of an exemplary process control computer program product used to control the exemplary CVD processing chamber of FIG. 1A.

FIG. 3 shows an illustrative block diagram of the hierarchical control structure of computer program 300. A user enters a process set number and process chamber number into a process selector subroutine 310 in response to menus or screens displayed on the CRT monitor by using the light pen interface. The process sets are predetermined sets of process parameters necessary to carry out specified processes, and are identified by predefined set numbers. Process selector subroutine 310 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of system controller 60.

A process sequencer subroutine 320 comprises program code for accepting the identified process chamber and set of process parameters from the process selector subroutine 310, and for controlling operation of the various process chambers. Multiple users can enter process set numbers and process chamber numbers, or a user can enter multiple process set numbers and process chamber numbers, so sequencer subroutine 320 operates to schedule the selected processes in the desired sequence. Preferably, sequencer subroutine 320 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 320 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 320 determines which process chamber and process set combination is going to be executed next, sequencer subroutine 320 causes execution of the process set by passing the particular process set parameters to a chamber manager subroutine 330A–C, which controls multiple processing tasks in chamber 13 and possibly other chambers (not shown) according to the process set determined by sequencer subroutine 320.

Examples of chamber component subroutines are substrate positioning subroutine 340, process gas control subroutine 350, pressure control subroutine 360, and plasma control subroutine 370. Those having ordinary skill in the art will recognize that other chamber control subroutines can be included depending on what processes are desired to be performed in chamber 13. In operation, chamber manager subroutine 330A selectively schedules or calls the process component subroutines in accordance with the particular process set being executed. Scheduling by chamber manager subroutine 330A is performed in a manner similar to that used by sequencer subroutine 320 in scheduling which process chamber and process set to execute. Typically, chamber manager subroutine 330A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 3. Substrate positioning subroutine 340 comprises program code for controlling chamber components that are used to load a substrate onto substrate support number 18. Substrate positioning subroutine 340 may also control transfer of a substrate into chamber 13 from, e.g., a PECVD reactor or other reactor in the multichamber system, after other processing has been completed.

Process gas control subroutine 350 has a program code for controlling process gas composition and flow rates. Subroutine 350 controls the open/close position of the safety shut-off valves, and also ramps up/down the mass flow controllers to obtain the desired gas flow rates. All chamber component subroutines, including process gas control subroutine 350, are invoked by chamber manager subroutine 330A. Subroutine 350 receives process parameters from chamber manager subroutine 330A related to the desired gas flow rates.

Typically, process gas control subroutine 350 operates by opening the gas supply lines, and repeatedly (i) reading the necessary mass flow controllers, (ii) comparing the readings to the desired flow rates received from chamber manager subroutine 330A, and (iii) adjusting the flow rates of the gas supply lines as necessary. Furthermore, process gas control subroutine 350 may include steps for monitoring the gas flow rates for unsafe rates, and activating the safety shut-off valves when an unsafe condition is detected.

In some processes, an inert gas, such as argon, is flowed into chamber 13 to stabilize the pressure in the chamber before reactive process gases are introduced into the chamber. For these processes, the process gas control subroutine 350 is programmed to include steps for flowing the inert gas into chamber 13 for an amount of time necessary to stabilize the pressure in the chamber. The above-described steps may then be carried out.

Additionally, when a process gas is to be vaporized from a liquid precursor, for example, tetraethylorthosilane (TEOS), the process gas control subroutine 350 may include steps for bubbling a delivery gas such as helium through the liquid precursor in a bubbler assembly or for introducing the helium to a liquid injection valve. For this type of process, the process gas control subroutine 350 regulates the flow of the delivery gas, the pressure in the bubbler, and the bubbler temperature to obtain the desired process gas flow rates. As discussed above, the desired process gas flow rates are transferred to process gas control subroutine 350 as process parameters.

Furthermore, the process gas control subroutine 350 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 350 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 360 includes program code for controlling the pressure in chamber 13 by regulating the size of the opening of throttle valve in the exhaust portion of the chamber. There are at least two basic methods of controlling the chamber with the throttle valve. The first method relies on characterizing the chamber pressure as it relates to, among other things, the total process gas flow, size of the process chamber, and pumping capacity. The first method sets throttle valve 26 to a fixed position. Setting throttle valve 26 to a fixed position may eventually result in a steady-state pressure.

Alternatively, the chamber pressure may be measured, with a manometer for example, and throttle valve 26 position may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 360 is invoked, the desired (or target) pressure level is received as a parameter from chamber manager subroutine 330A. Pressure control subroutine 360 operates to measure the pressure in chamber 13 by reading one or more conventional pressure manometers connected to the chamber, compare the measure value (s) to the target pressure, obtain proportional, integral, and differential (PID) values from a stored pressure table corresponding to the target pressure, and adjust throttle valve 26 according to the PID values obtained from the pressure table. Alternatively, pressure control subroutine 360 may open or close throttle valve 26 to a particular opening size to regulate the pressure in chamber 13 to a desired pressure or pressure range.

Plasma control subroutine 370 comprises program code for controlling the frequency and power output setting of RF generators 31A and 31B, and for tuning matching networks 32A and 32B. Plasma control subroutine 370, like the previously described chamber component subroutines, is invoked by chamber manager subroutine 330A.

An example of a system which may incorporate some or all of the subsystems and routines described above would be an Ultima System, manufactured by Applied Materials, configured to practice the present invention.

III. Exemplary Structure

Figure 4:
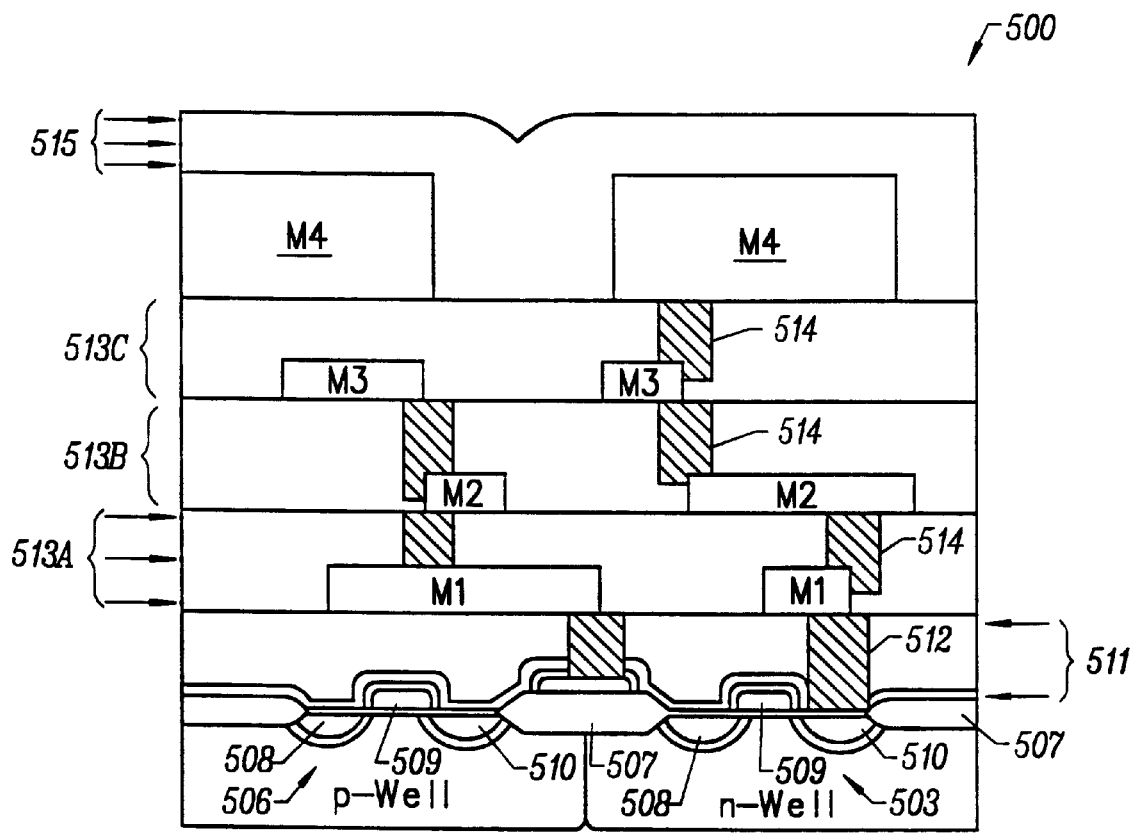
FIG. 4 is a simplified cross-section of part of an integrated circuit produced according to one embodiment of the present invention.

FIG. 4 illustrates a simplified cross-sectional view of an integrated circuit 500 incorporating features of the present invention. Integrated circuit 500 may be fabricated on a semiconductor wafer, such as a silicon wafer, gallium-arsenide wafer, or other wafer. As shown in FIG. 4, integrated circuit 500 includes NMOS and PMOS transistors 503 and 506, which are separated and electrically isolated from each other by a field oxide region 507. Each transistor 503 and 506 comprises a source region 508, a gate region 509, and a drain region 510.

A premetal dielectric layer 511 separates transistors 503 and 506 from metal layer M1, with connections between metal layer M1 and the transistors made by contacts 512. Metal layer M1 is one of four metal layers, M1–M4, included in integrated circuit 500. Each metal layer M1–M4 is separated from adjacent metal layers by respective intermetal dielectric (IMD) layers 513A–C. Adjacent metal layers are connected at selected openings by vias 514. Planar passivation layer 515 overlies metal layer M4.

Embodiments of the present invention are particularly useful for IMD layers, but may find uses in each of the dielectric layers shown in integrated circuit 500. It should be understood that the simplified integrated circuit 500 is for illustrative purposes only. One of ordinary skill in the art could implement the present method for fabrication of other integrated circuits, such as microprocessors, application-specific integrated circuits, memory devices, and the like. Additionally, the method of the present invention may be used in the fabrication of integrated circuits using other technologies, such as BiCMOS, NMOS, bipolar, and others.

IV. Deposition Recipe Step Sequencing

Figure 5:
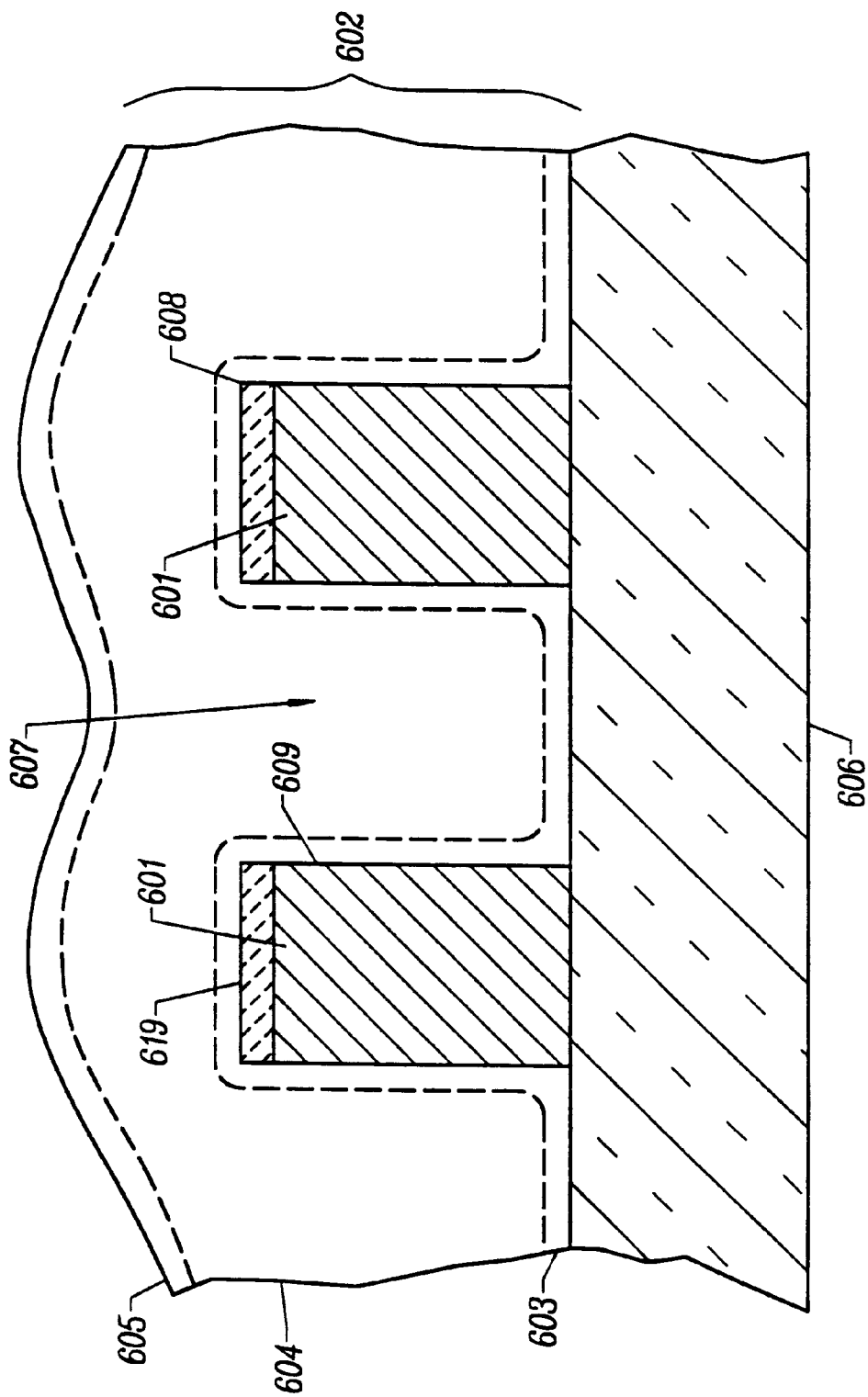
FIG. 5 is a simplified cross-section of an FSG layer deposited over metal traces on a semiconductor wafer according to one embodiment of the present invention.

Referring now to FIG. 5, an insulating film 602 formed according to an embodiment of the present invention is shown deposited over metal lines 601 and within gap 607 on wafer 606. In one preferred embodiment, wafer 606 is a silicon wafer. Insulating film 602 is comprised of USG liner 603, FSG bulk layer 604, and FSG skin layer 605. USG liner 603, FSG bulk layer 604, and FSG skin layer 605 are formed in one substantially continuous deposition process. USG liner 603 is between about 150 Å and 600 Å, but more preferably between about 300 Å and 400 Å. Proper sequencing of the recipe steps prior to and during the formation of the USG layer 603, FSG bulk layer 604, and FSG skin layer 605 insure superior stability of insulating film 602. In this instance, antireflective layer 619 sits atop metal lines 601. In a preferred embodiment, antireflective layer 619 may be a layer of titanium nitride.

In one embodiment, the proper sequencing of recipe steps relates to an HDP-CVD deposition system, in which the substrate is heated to the proper temperature by a plasma before depositing any USG. However, the substrate may be heated by electrical resistance heaters, radiant lamp heaters, heat of reaction, or other means, in addition to the RF plasma. The surface of the substrate is kept reasonably hot as fluorine is admitted into the chamber. In an HDP-CVD process, the plasma enhances deposition characteristics, but may also sputter off some or all of the deposited layer. This process is called cosputtering. The proper RF power level is selected according to the process pressure, substrate temperature, types of deposition gases used, and pre-existing patterned layers on the wafer, among other things. A similar effect arises because of the presence of fluorine in the plasma. The fluorine species may co-etch the FSG layer as it is being deposited. This may be described as a ratio of the rate of deposition to the rate of etching. Ratios greater than 1 result in a net deposition, and ratios less than 1 indicate that material is being etched faster than it is being deposited. Therefore, when depositing FSG layers on wafers that have high, narrow, closely spaced metal traces (such as 1 $\mu$m high metal trace separated from a similar trace by a gap of 0.18 μm) or other similar (high aspect ratio) features, it is important to choose the proper RF power levels and fluorine plasma concentration so that the gaps between traces are kept open during the deposition so that the gap may be filled with the desired layer, without oversputtering or overetching the traces or other features on the wafer. Typically, most of the sputtering and etching occurs at the corners 608 of the traces. Additionally, as the gap is filled, the aspect ratio, that is the ratio of gap height to gap width, changes, and the RF power and fluorine concentration may be changed accordingly. Typically, more deposition occurs on the horizontal surfaces than on the walls of the traces 609, therefore the aspect ratio decreases as the deposition proceeds.

The substrate temperature may be controlled with a thermostat, or the substrate temperature may be characterized for specific operating conditions. In the following example, the substrate is heated with the plasma according to characterizations of operating conditions of the deposition system. The wet etch relative ratio (WERR) of oxide films grown under various system operating conditions may be used to characterize the surface temperature of a substrate during oxide layer formation. These methods are well known in the art.

Figure 6:
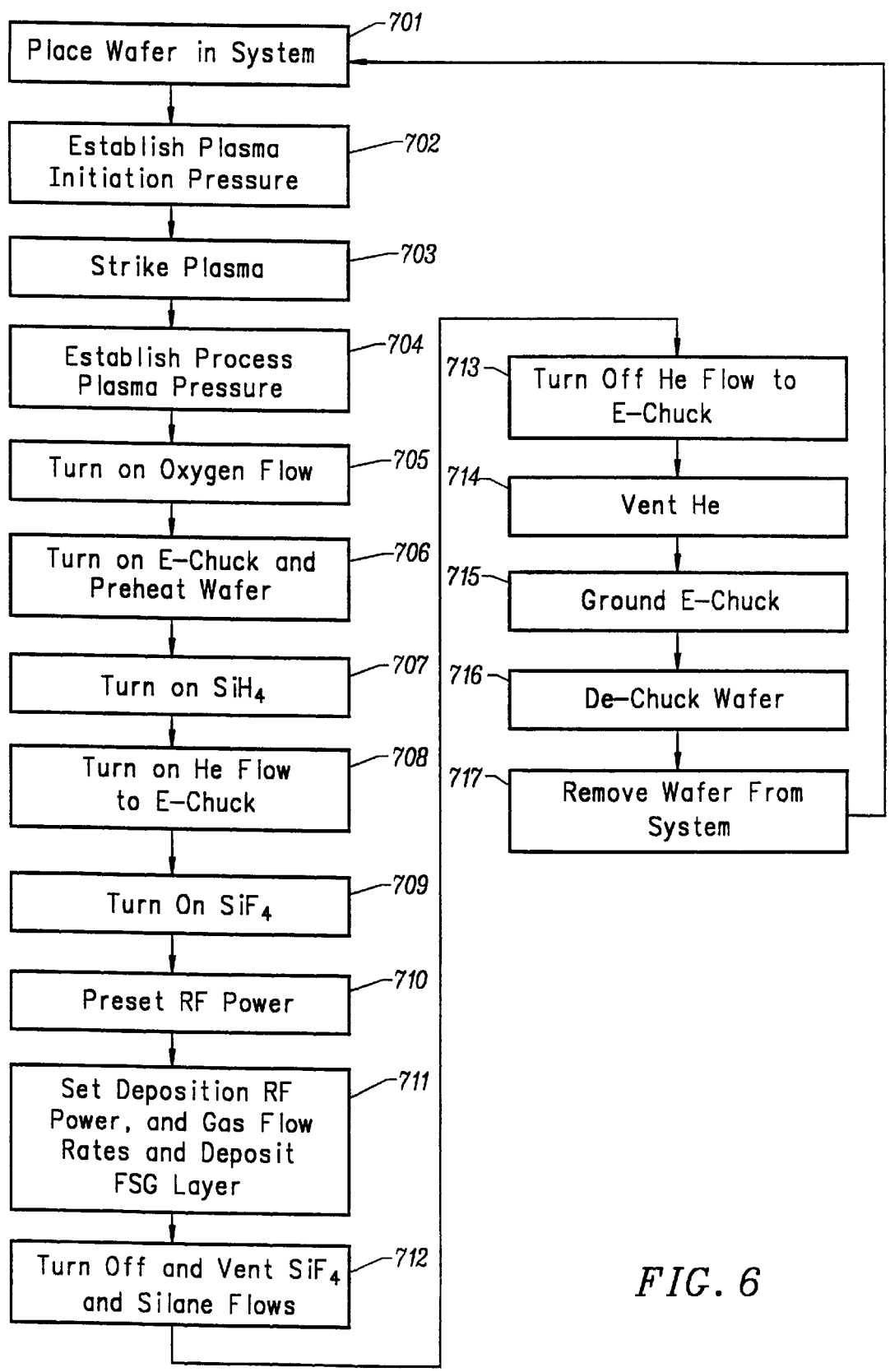
FIG. 6 is a flow chart of an exemplary processing sequence according to the present invention.

FIG. 6 is a flow chart showing one embodiment of the sequence of steps of the present invention. The temperature of the substrate when fluorine is first admitted into the chamber is important because it affects how well fluorine is incorporated into the growth surface of the glass layer. Accordingly, the sequence of steps involved with preheating the substrate prior to the onset of a halogen-containing gas flow may be critical. If the substrate has pre-existing aluminum features, it may be especially important to heat the substrate sufficiently to form an initial layer of FSG at a sufficiently high temperature without damaging the aluminum features. The following process relates to a nominally 200 mm diameter silicon wafer in a deposition chamber with a specific interior volume; however, those skilled in the art will appreciate that the process could be modified for different substrate materials, different substrate sizes, and different chamber volumes, among other variations.

A substrate is placed in the deposition system (step 701), and argon is admitted at a rate of 95 sccm to gas nozzles 39 and at a rate of 15 sccm to top nozzle 45. These gas flows establish an initial chamber pressure of about 50 millitorr (step 702), based on a fixed throttle valve setting. A plasma is struck at this initial pressure (step 703) by applying 1,000 W of RF power to top coil 29. One second is allowed to establish a stable plasma, before the throttle valve is opened to lower the chamber pressure to the deposition pressure of between 3–5 millitorr. The throttle valve may be opened to a set position for a specific period of time, which may result in a desired pressure, based upon prior characterization of the deposition system. Concurrent with setting the chamber pressure to the deposition pressure, the total plasma energy is increased by applying 2,000 W of RF power to the side coil, in addition to the 1,000 W already being applied to the top coil (step 704).

During the next step, the top coil power is increased to 1500 W, the side coil power is increased to 3500 W, and the oxygen flow to the chamber is turned on (step 705) at an initial flow of 30 sccm. One-half second later, a negative voltage is applied to an e-chuck (step 706), which draws the substrate in intimate contact with the e-chuck. Applying a negative, rather than positive, voltage enhances the transport of positively charged plasma species to the substrate. The e-chuck has inner and outer cooling rings intended to carry heat-transfer gas. Helium is a preferred gas for flowing through the inner and outer channels to thermally couple the substrate and the e-chuck. The e-chuck may be cooled (or in some embodiments heated) by heat-transfer liquid, such as water or a water/glycol mixture, flowing in passages (not shown) within the e-chuck. The heat-transfer liquid is maintained at a temperature of about 60° C. by the cooling system. Because helium does not yet flow through the cooling rings, there is relatively little thermal transfer between the substrate and the e-chuck. This allows the substrate to heat up more rapidly than if the cooling helium was flowing.

The substrate is preheated by the plasma for six seconds (step 706). During this period the oxygen flow is increased to 126 sccm, flowing from the oxidizer nozzles at a rate of 110 sccm, and flowing from the top vent at a rate of 16 sccm. The thermal mass of the system components and the short time period involved make the use of feedback-based temperature control systems difficult for this step of the process. Therefore, it is important to understand the relationship between the plasma heating, the thermal mass of the substrate and chuck, and the power and pressure of the plasma. For example, a plasma at a higher pressure may transfer more heat to the substrate and damage pre-existing features on the substrate, such as aluminum traces, if maintained for the same period under otherwise similar conditions.

After the substrate has been preheated, silane is admitted to the chamber at a rate of 35 sccm (step 707), which includes 30 sccm from source gas nozzles 39 and 5 sccm from top nozzle 45. This grows a layer of USG about 300–400 Å thick in a period of 3 seconds on the preheated substrate, in preparation for FSG deposition. After this liner layer has been deposited, helium is flowed through the cooling channels in e-chuck 20 (step 708), thermally coupling the substrate to the water-cooled chuck and thus cooling the substrate. The helium pressure within these channels may be higher than the chamber pressure, resulting in a force pushing the substrate away from the chuck, however, the attractive force of the e-chuck to the substrate is sufficient to hold the wafer on the e-chuck.

The next step introduces fluorine into the deposition system (step 709). Silicon tetrafluoride is admitted at the relatively low flow rate of 5 sccm from oxidizer nozzles 40 for one second. Among other things, this fills the distribution lines down stream from the $SiF_4$ mass flow controller with $SiF_4$. It is believed that the initial fluorine species present at the onset of the $SiF_4$ flow react on a substrate surface that is above at least 100° C., as a result of the preceding preheat step 706. This may result in an initial FSG layer 610 (FIG. 5) in which the fluorine is tightly bound in the glass lattice. The thickness of this initial FSG layer depends on many factors, including the thermal capacity of the plasma-heated wafer, and may be only a few atomic layers, or about 100 Å, thick. Free fluorine (fluorine that is not tightly bound in the glass) is undesirable because free fluorine may corrode metal traces or antireflective layers, especially titanium nitride antireflective layers. The relatively low concentration of fluorine present at the onset of the $SiF_4$ flow limits the potential accumulation of free fluorine in this portion of the layer.

In preparation for the main deposition step, the pressure feedback loop controlling the throttle valve is activated. That is, in the preceding steps, the throttle valve was set to a fixed position, the chosen position being appropriate for the chamber volume, exhaust capacity, and gas flows, as discussed above. Now, the throttle valve position is controlled according to a pressure reading from a manometer to maintain a chamber pressure of 6 millitorr. This provides greater accuracy, stability, and repeatability of chamber pressure during the deposition process.

The RF power is now reduced (step 710), in anticipation of the main deposition step. The RF power level is set to 900 W to top coil 29 and 2300 W delivered to side coil 30. The $SiF_4$ flow is increased to 10 sccm, and the silane flow is increased to 45 sccm and 4.5 sccm from source nozzles 39 and top nozzle 45, respectively. The oxygen flow is decreased to 84 sccm and 5.7 sccm from oxidizer nozzles 40 and top vent 46, respectively. These conditions are held for 2 seconds to set and maintain the proper pressure for the desired FSG deposition to fill narrow gaps without overetching the existing substrate features by either sputter etching or fluorine etching. During this time it is believed that a relatively high quality FSG layer (one that tightly binds fluorine into the glass structure) about 200 Å thick is formed over the liner because the surface of the liner layer is still relatively hot, as discussed above. The relatively high substrate surface temperature, low rate of deposition gas flows, and low RF power are believed to all contribute to the quality of the initial FSG layer.

The majority of the FSG layer is deposited during the main deposition step (step 711). The temperature of the wafer is lower in this step than in the preceding step, increasing the deposition-to-etch ratio, which results in a higher rate of deposition. During this step, the RF bias power matching control circuit is essentially disabled by increasing the control limit to 1500 W. This means that the RF bias power match system will not attempt to alter the configuration of the matching networks unless the reflected power exceeds 2500 W. Because the matching networks have already been tuned to the chamber with a plasma during the preceding steps, it is unlikely that the reflected power will exceed 2500 W during this deposition step. During step 711, 900 W of power is supplied to top coil 29, and 2300 Watts of power is supplied to side coil 30. Throttle valve 26 is controlled to maintain a chamber pressure of 6 mnillitorr, while the argon flow to source nozzles 39 is decreased to 46 sccm and the argon flow through top nozzle 45 is decreased to 9 sccm. The deposition proceeds for approximately 157 seconds, depending on the desired final thickness.

After the desired thickness has been deposited, the flow of silane and $SiF_4$ are turned off (step 712) and the gas delivery lines associated with these flows are dumped to foreline vacuum 44 through three-way valves, such as valves 43A–C, as shown in FIG. 1A. This removes gas residue from these delivery lines. It is undesirable to leave some gases in their respective delivery lines, as some gases may be flammable, toxic, or corrosive. Additionally, some reactant gases are unstable, and allowing them to remain in the line until the next wafer deposition may result in inconsistent or contaminated layers. The RF bias power match control limits are also reduced to 500 W during this step. After one half-second, the helium flowing in the cooling channels in e-chuck 20 is turned off, and the power to top RF coil 29 is increased to 1000 W, while the power to side RF coil 30 is decreased to 2000 W (step 713). This may heat the surface of the FSG layer, forming a thin skin of FSG in which fluorine is more tightly bound in the glass structure than in the bulk FSG layer. This skin layer reduces the transport of water or water vapor to or from the bulk FSG layer. Silicon oxide, and especially fluorinated silicon oxide (which forms the FSG layer), is hydrophilic, that is, it will absorb water vapor from the surrounding environment. Some water vapor is present in the deposition environment. This water vapor may be incorporated into the bulk FSG layer because, among other reasons, the wafer is below 100° C. Additionally, were it not for the skin layer, the bulk FSG might absorb water from the air, forming haze or bubbles, or which may combine with free or loosely bound fluorine to form corrosive hydrofluoric acid, or which may increase the relative dielectric constant of the layer.

The timing of the next step is important in some embodiments. The helium in the cooling channels (which is not flowing but still provides some pressure to the backside of the wafer) is vented to the foreline vacuum (step 714) and about 3 seconds later, the e-chuck is turned off by grounding the chuck (step 715). The plasma provides a source of ions to neutralize the electrostatic forces between the substrate and the e-chuck, and the residual helium back pressure gently breaks the seal between the substrate and chuck before all of the helium is evacuated by the foreline. Without the helium back pressure, the substrate may stick to the chuck, making unloading difficult. If the e-chuck is turned off before enough helium has vented, the substrate may flip off the chuck. Finally, if the e-chuck is turned off without a plasma present, it may take an unacceptably long time for the wafer and chuck to equilibrate, and allow removal of the substrate from the chuck. The wafer is then ready for dechucking (step 716) and removal from the chamber (step 717).

The exemplary process described above is for illustrative purposes only. Many process parameters relate to the specific chamber the process is intended to be performed in, in this instance a commercially available ULTIMA chamber, manufactured by Applied Materials, Inc., of Santa Clara, Calif. Other chambers may have different volumes, exhaust capacities, plasma configurations, wafer chucking systems, etc., which may result in a process with different pressures, gas flow rates, plasma powers, times, or other process parameters. Additionally, different substrates may result in different process parameters. For example, a process intended for a substrate with a different thermal capacity or thermal conductivity may have longer or shorter preheating step. Additionally, a substrate with pre-existing features that can withstand a higher temperature than aluminum features may be heated to a higher temperature without damage. Furthermore, other gases may be used in the process, such as TEOS for a source of silicon, or $F_2$ as a source of fluorine.

V. Test Results

Samples were prepared by growing layers on 200-mm silicon wafers according to the exemplary process given above. Some samples had metal traces 0.8 $\mu$m high that were spaced 0.18 $\mu$m apart (the gap having an aspect ratio of 4.44:1). These gaps were filled with the deposited layer (USG liner layer, FSG bulk layer, and FSG skin layer), sectioned, and examined using a scanning electron microscope. No voids resulting from the gaps growing shut were found. The layers incorporated sufficient fluorine to lower the relative dielectric constant of the layer to 3.73.

Stability of the FSG layers was confirmed by storing a sample of 5 wafers for 21 days and inspecting for haze or bubble formation, and nondestructively testing film parameters such as residual film stress and dielectric constant. No haze or bubbles were observed in the sample population, and no significant change in film stress or dielectric constant occurred.

Additionally, pyrometric measurements, which is a destructive test method, were done on another population of wafers with about 6000-Å-thick deposited layers. Wafers were stored under ambient conditions for 1, 2, and 3 weeks. The sample wafers were heated to progressively higher temperatures in a vacuum while measuring the concentration of water vapor released from the sample. Integrating the area under the curve provides an indication of the total water desorbed from the wafer. No significant outgassing or desorbtion of water vapor was observed at temperatures up to 500° C.

Figure 7:
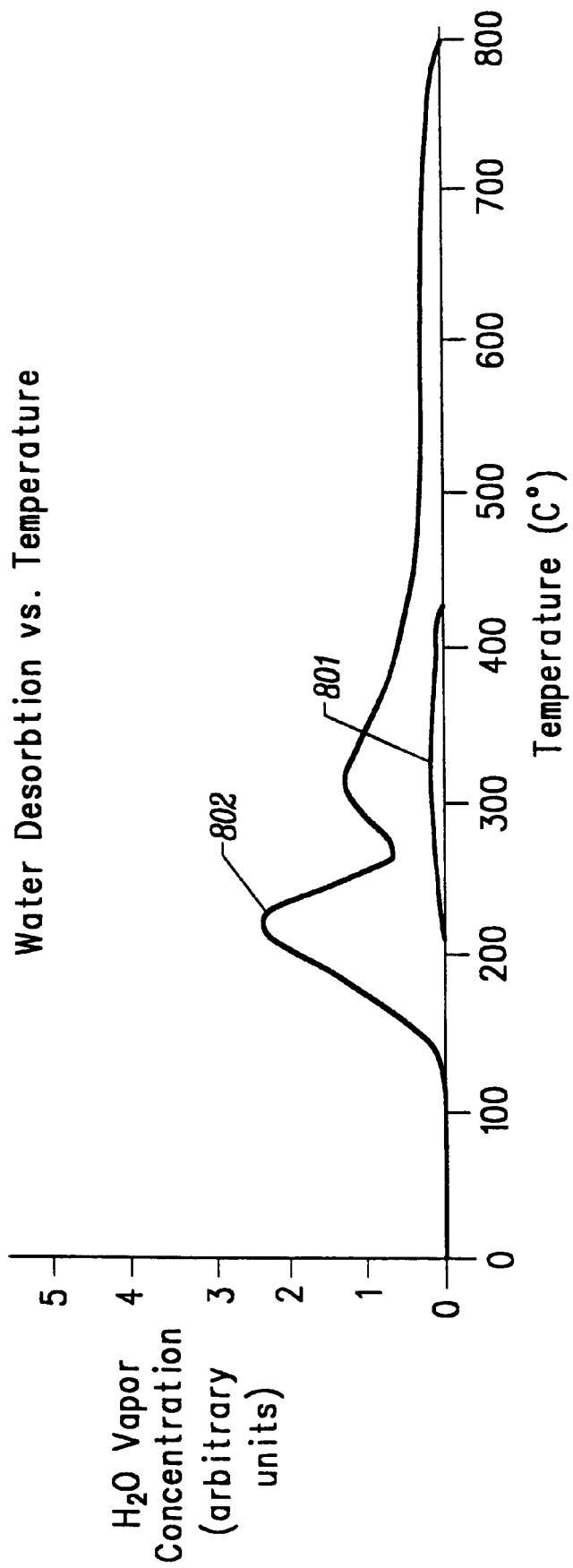
FIG. 7 is a graph showing water desorbtion from an FSG film as deposited and after removal of the top layer of FSG.

FIG. 7 shows a pyrogram for a wafer as deposited (trace 801) and for the same wafer after removing approximately 1700 Å from the surface of the FSG layer with a wet etch process (trace 802). It is assumed that this etch removed the FSG skin layer. These traces show that the FSG skin layer provides a barrier to the adsorption and desorbtion of water from the bulk FSG layer, thus promoting layer stability.

The method of the present invention is not intended to be limited by the specific parameters set forth above. Those of ordinary skill in the art will realize that different processing conditions and different reactant sources can be used without departing from the spirit of the invention. Other equivalent or alternative methods of depositing an insulating layer according to the present invention will be apparent to those skilled in the art. These equivalents and alternatives are intended to be included within the scope of the present invention. Other variations will be apparent to persons of skill in the art. Accordingly, it is not intended to limit the invention except as provided in the appended claims.

What is claimed is:

1. A substrate-processing apparatus for forming a fluorinated silicon glass layer on a substrate, the apparatus comprising:
   (a) a processing chamber;
   (b) a gas delivery system coupled to said processing chamber;
   (c) a plasma system coupled to said processing chamber;
   (d) a controller configured to control said gas delivery system and said plasma system; and
   (e) a memory, coupled to said controller, comprising a computer-readable medium having a computer-readable program embodied therein for directing operation of the substrate processing apparatus, said computer-readable program comprising:
      (i) computer instructions that control said gas delivery system and said plasma system to flow a plasma gas into said chamber and to form a plasma at a plasma power therefrom;
      (ii) computer instructions that control said gas delivery system to flow a non-halogen-containing source gas into said chamber after said plasma has heated a substrate in said chamber for a first period of time to a temperature of at least about 100° C. to form a non-halogenated layer;
      (iii) computer instructions that control said gas delivery system to flow a halogen-containing gas at a halogen-containing gas flow rate into said chamber within a second period of time, wherein said second period of time is sufficient to form a first portion of a halogen-containing layer on said non-halogenated layer while the temperature of the substrate is at least about 100° C.; and
      (iv) computer instructions that control said gas delivery system and said plasma system to reduce said plasma power and to increase said halogen-containing gas flow rate to form a second portion of the halogen doped layer.

2. The apparatus of claim 1 further comprising a vacuum system coupled to said process chamber.

3. The apparatus of claim 2 wherein said controller is further configured to control said vacuum system.

4. The apparatus of claim 1 wherein said plasma system includes at least one source coil, disposed proximate said chamber and at least one source RF generator coupled to said at least one source coil.

5. The apparatus of claim 4 wherein said process chamber includes a dome and said at least one source coil includes a top coil disposed on top of said dome.

6. The apparatus of claim 4 wherein said process chamber includes a dome and said at least one source coil includes a side coil mounted said dome.

7. The apparatus of claim 4 wherein said plasma system further comprises a bias generator coupled to a substrate support.

8. The apparatus of claim 4 wherein said processing chamber is a high density plasma processing chamber.

9. The apparatus of claim 1 wherein said program further comprises a set of computer instructions for cooling the substrate after forming said non-halogenated layer.

10. A computer readable storage medium having program code embodied therein, said program code for controlling a substrate processing system having a deposition chamber, said program code controlling the substrate processing system to form a film on a substrate in accordance with the following steps:
   (a) heating the substrate in the chamber to a temperature of at least about 100° C.;
   (b) flowing a silicon-containing process gas into the chamber under conditions suitable for depositing silicon glass;
   (c) forming a layer of undoped silicon glass on the substrate;
   (d) flowing a halogen-containing gas into the chamber at a flow rate, while the temperature of the substrate is at least about 100° C., to form a first portion of a halogen-containing silicon oxide layer on said layer of undoped silicon glass; and
   (e) increasing the flow rate of the halogen-containing gas and lowering the temperature of the substrate to form a second portion of the halogen-containing silicon oxide layer.

11. The computer readable storage medium of claim 10 wherein said step (a) includes heating the substrate with a plasma.

12. The computer readable storage medium of claim 11 wherein said plasma is a high density plasma.

* * * * *